United States Patent
Höppner et al.

(10) Patent No.: US 6,609,874 B2
(45) Date of Patent: Aug. 26, 2003

(54) HANDLER FOR THE TRANSPORTING OF FLAT SUBSTRATES FOR APPLICATION IN THE SEMI-CONDUCTOR INDUSTRY

(75) Inventors: Jürgen Höppner, Fahrenzhausen (DE); Josef Zimmermann, Regensburg (DE); Johannes Schlip, Bad Wiessee (DE)

(73) Assignee: PRI Automation, Inc., Chelmsford, MA (US)

( * ) Notice: Subject to any disclaimer, the term of this patent is extended or adjusted under 35 U.S.C. 154(b) by 0 days.

(21) Appl. No.: 09/924,146

(22) Filed: Aug. 7, 2001

(65) Prior Publication Data

US 2002/0044863 A1 Apr. 18, 2002

(51) Int. Cl.[7] ................................................. B25J 15/00
(52) U.S. Cl. ..................... 414/744.1; 198/630; 198/768; 294/64.3
(58) Field of Search ........................... 414/744.1, 744.5; 901/30; 294/1.1, 64.3; 198/630, 768

(56) References Cited

U.S. PATENT DOCUMENTS

| 5,702,228 A | 12/1997 | Tamai et al. ............. 414/744.5 |
| 5,810,155 A | 9/1998 | Hashimoto et al. ......... 198/630 |
| 6,095,582 A * | 8/2000 | Siniaguine et al. ........ 294/64.3 |
| 6,231,297 B1 * | 5/2001 | Hofmeister ............... 414/744.5 |

FOREIGN PATENT DOCUMENTS

DE 199 16 872 C1 4/2000

* cited by examiner

Primary Examiner—Donald W. Underwood
(74) Attorney, Agent, or Firm—Weingarten, Schurgin, Gagnebin & Labovici, LLP

(57) ABSTRACT

A handler for transporting planar substrates, in particular wafers, used in the semiconductor industry, between at least two stations. The handler includes a movable flat support arm for receiving a substrate and means for defining the location of the substrate in the area of a predetermined point on the support arm. A vibration generator for generating a longitudinal ultrasonic vibration is provided, that the vibration generator interacts with the support arm in such a way that a substantially stationary vibration with at least one antinode can be set on the flat support arm, which permits a levitation of a substrate placed thereon. A means for defining the location of the substrate provide a lateral positioning exclusively by an interaction with the edge area of a substrate.

12 Claims, 4 Drawing Sheets

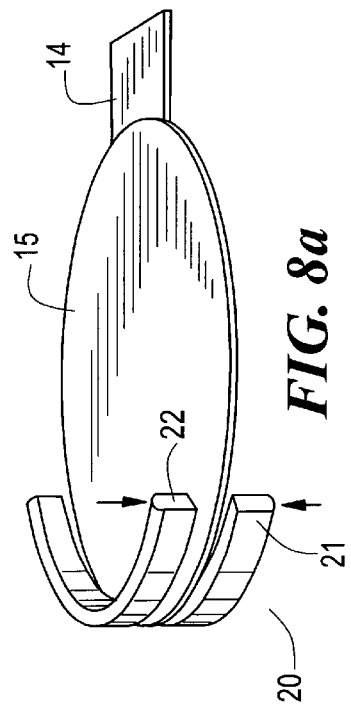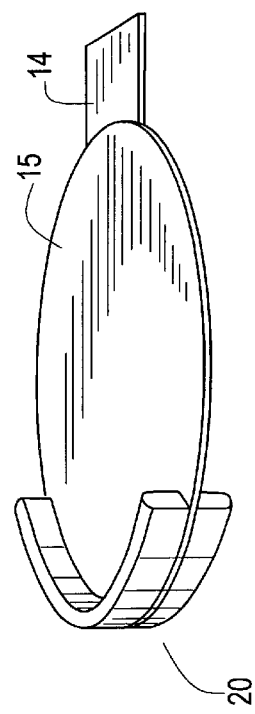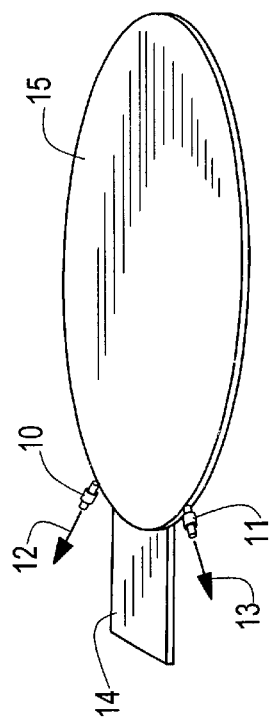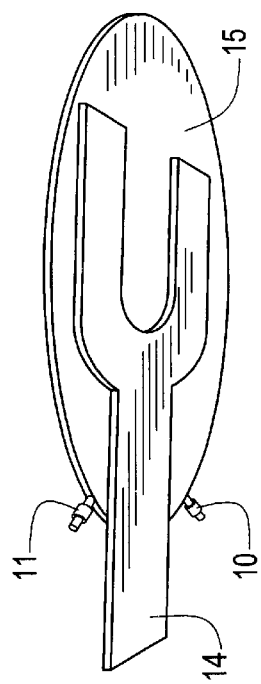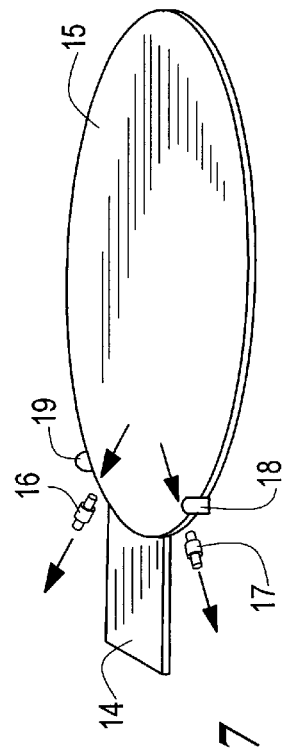
FIG. 6a
FIG. 6b
FIG. 7
FIG. 8a
FIG. 8b

HANDLER FOR THE TRANSPORTING OF FLAT SUBSTRATES FOR APPLICATION IN THE SEMI-CONDUCTOR INDUSTRY

CROSS REFERENCE TO RELATED APPLICATIONS

The present application claims priority of German application No. 10039482.5 filed Aug. 8, 2000.

STATEMENT REGARDING FEDERALLY SPONSORED RESEARCH OR DEVELOPMENT

Not Applicable

BACKGROUND OF THE INVENTION

The invention relates to a handler for transporting planar substrates, in particular wafers, used in the semiconductor industry.

In semiconductor production it is known that every contact between a wafer and a bearing surface, for example in a storage cassette or during transport between work stations on the support arm of a wafer handler, can generate particles which can adversely affect the production yield.

Moreover, it has been found that areas of a wafer which have come into contact with a bearing surface no longer have a sufficient surface quality for them to be used in a conventional production process which includes photolithographic steps.

U.S. Pat. No. 5,810,155 discloses an object-transporting device which uses acoustic levitation. This object-transporting device comprises a transport track for this purpose. The transport track is set in vibration on one side by an ultrasound generator, and an absorber is provided at another point on the transport track. In this way, a migrating bending wave develops on the transport track by means of which an object lying thereon can be transferred along the transport track with the wave. Said patent specification thus follows another principle and is therefore not relevant to the present invention.

The underlying principle of acoustic levitation on a flexural vibrator set in vibration by a vibration generator is described in the publication "The Journal of the Acoustical Society of America", Vol. 100, No. 4, part 1, October 1996, Hashimoto et al.: "Near-field acoustic levitation of planar specimens using flexural vibration". However, said publication does not contain any reference to integrating such a flexural vibrator in a concrete handler for planar substrates.

It would therefore be desirable to provide a handler, in particular for wafers, which would largely avoid the above-mentioned problems.

SUMMARY OF THE INVENTION

A handler is disclosed for transporting planar substrates, in particular wafers, used in the semiconductor industry, between at least two stations. The handler comprises a movable flat support arm for receiving a substrate and means for maintaining the substrate in a predetermined position on the support arm. A vibration generator is provided for generating a longitudinal ultrasonic vibration. The vibration generator interacts with the support arm in such a way that a substantially stationary vibration with at least one antinode can be generated on the flat support arm. This permits a levitation of a substrate placed thereon. The means for defining the location of the substrate provide lateral positioning exclusively by an interaction with the edge area, preferably the rim of the substrate. By this procedure, a substrate can be taken up from one work station by means of the support arm, without any appreciable contact being made with the underside, transported to another work station by movement of the support arm, and deposited there, likewise without any appreciable contact being made with the underside of the substrate. In this way, not only is it possible to avoid unnecessary particle generation caused by an interaction of the support arm with a bearing surface, but the underside of a substrate can be used without any loss of quality in, for example, a photolithographic production step. This procedure is based on the knowledge that, when a support arm interacts with a vibration generator, the support arm represents a flexural vibrator in which a near-field levitation is used to lift a substrate when a substantially stationary vibration develops on the flexural vibrator.

The means for lateral positioning of the substrate prevent a "drifting" of the levitated substrate on the support arm. For this purpose, the means for lateral positioning act very specifically on only the edge area of a substrate, preferably only on the outer rim of a substrate in the case of tactile positioning, in order to avoid an undesired interaction with, in particular, inner areas of the underside of the substrate.

Near-field levitation develops in a favorable manner in particular when the vibration generator interacts with the support arm in such a way that a substantially stationary vibration with a multiplicity of vibration nodes is set on the flat support arm.

In addition, it is particularly advantageous if the vibration generator is arranged on the support arm in such a way that the longitudinal vibration axis is oriented perpendicular to the plane of the flat support arm. In this way the energy of the vibration generator can be transmitted particularly effectively to the support arm.

In a preferred embodiment of the invention, the support arm is configured in such a way that a received substrate is accessible from underneath in the area of a predetermined lateral position, for example, a transport position. This can be achieved by means of openings made in the support arm or by an appropriate shape, for example, a fork or tongue shape or the like. These shapes are based on the knowledge that levitation of a component on a support arm designed in this way functions free of problems, even though the bearing surface for the substrate is smaller than the substrate surface. Finally, this affords the advantage that the substrate can be easily taken up and then deposited again.

In a preferred embodiment of the invention, the means for lateral positioning of a substrate can comprise one or more suction heads which act on the edge area of the substrate. In this way the substrate comes into only minimal contact on the suction points of the suction heads at the edge.

In one embodiment of the invention, the substrate is laterally centered in the desired position by at least one limit stop which acts on the edge area of a substrate. The positioning with one or more limit stops can also take place in combination with suction heads which, by means of their suction action, draw the substrate toward the limit stops. In another embodiment of the invention, the means for providing lateral positioning comprises a clamp device. The clamp device can hold an edge area of the substrate in as it were the manner of forceps.

Lateral positioning of a substrate in the desired position can also be achieved by means of the support arm being tilted away from the horizontal, that is to say inclined. This embodiment is advantageous in particular in combination with suitably arranged limit stops. In a further embodiment of the invention, devices are provided which permit completely contactless lateral positioning of a substrate. The substrate can thus be "handled" in a completely contactless manner, by which means particle generation or surface contamination because of contacts can be completely avoided. A contactless positioning can be achieved by a reflector arranged laterally on the substrate or by several such reflectors which preferably do not communicate with the support area of the support arm.

Moreover, at least one additional vibration generator can be used in the area of the substrate for contactless lateral positioning, which additional vibration generator preferably does not communicate with the support area of the support arm.

Likewise, one or more nozzles through which gas or air flows can be used for contactless positioning.

Depending on the intended use, a plurality of support arms can be arranged either alongside one another and/or above one another and/or opposite one another. These support arms can be fed from one or more vibration generators for developing a flexural vibration, it being possible for the one vibration generator or the several vibration generators to be arranged on and/or under the support arms.

BRIEF DESCRIPTION OF THE SEVERAL VIEWS OF THE DRAWING

A number of illustrative embodiments of the invention are shown in the drawings. The invention is discussed in greater detail in the Detailed Description of the Invention with reference to the drawings of which:

FIGS. 6a to 11 show different embodiments for lateral positioning of a substrate on a support arm in perspective views from above, and in FIG. 6b also from underneath.

DETAILED DESCRIPTION OF THE INVENTION

Figure 1:
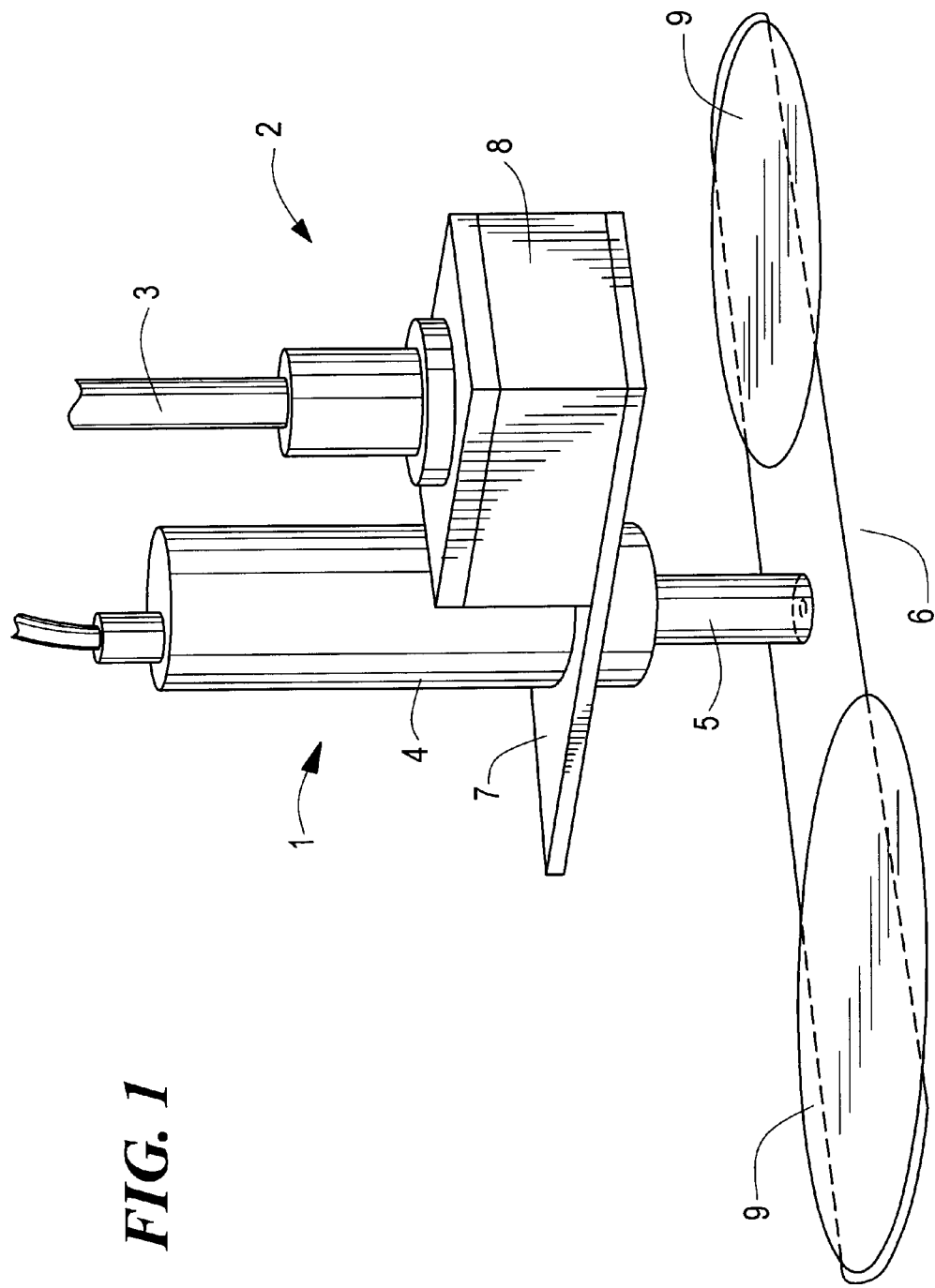
FIG. 1 shows a perspective view of the front part of a wafer handler with vibration generator in a motion system.
Figure 2A:
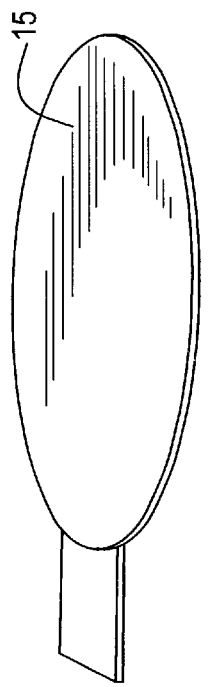
FIGS. 2a to 5 show perspective views of different support arm geometries, from underneath and partially from above.
Figure 2B:
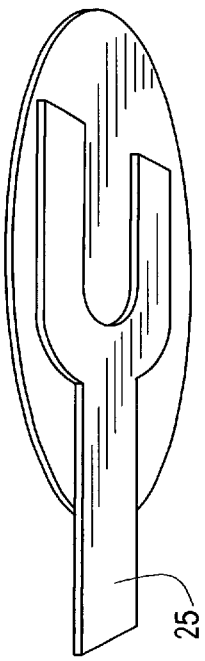
Figure 3A:
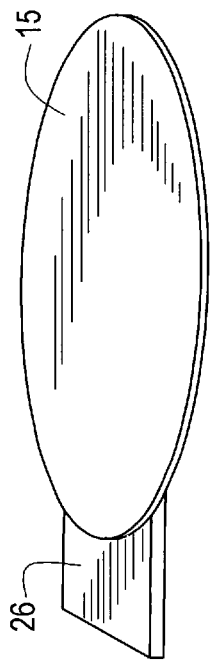
Figure 3B:
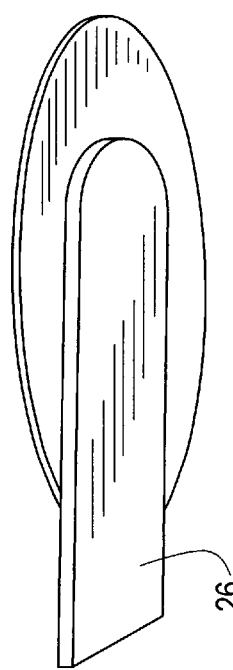
Figure 4:
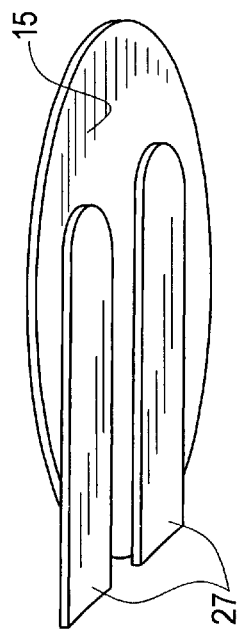

FIG. 1 shows a "front part" 1 of a wafer handler 2 on a transfer system 3.

The front part 1 chiefly comprises a vibration generator 4 which is securely connected mechanically by coupling elements 5 to a support arm 6 which, in this example, offloads at both ends. The vibration generator 4 is arranged via connection elements 7 on an intermediate piece 8 that is connected to the transfer system 3. The support arm 6 is thus connected to the transfer system only via the coupling elements 5 and the vibration generator 4.

The support arm 6 realizes the principle of a flexural vibrator which is excited with 24 kHz from the vibration generator 4, for example, an ultrasound source. In the acoustic near-field of the support arm 6 set in flexural vibration, a wafer 9, for example of 200 mm, can be held at a levitation height of ca. 0.1 to ca. 0.5 mm, for example, on both sides.

The lateral positioning of the wafers 9 is achieved in FIG. 1 by adjustable tactile limit stops (not shown).

Further possible ways of lateral positioning are shown diagrammatically in FIGS. 6a to 11.

In FIG. 6a, the lateral positioning is obtained by two suction heads 10, 11 which engage on the wafer either on the edge, as shown in FIGS. 6a and 6b, or in the edge area from above or below (not shown) and hold this wafer secure by means of a vacuum. The arrows 12, 13 in FIG. 6a symbolize the direction of suction.

By means of this procedure, a wafer 15 deposited on a support arm 14 remains completely accessible from the front. An alternative to this is shown in FIG. 7 in which a lateral positioning of a wafer 15 on a support arm 14 is achieved by a combination of suction heads 16, 17 with limit stops 18, 19. The wafer 15 is drawn in accordance with the indicated arrows but does not touch the suction heads 16, 17 since the limit stops 18, 19 place the wafer at a slight distance in front of the suction heads 16, 17.

According to FIGS. 8a and 8b, a wafer 15 can also be laterally fixed on a support arm 14 by a clamp device 20, for example having two clamp jaws 21 and 22. In FIG. 8a the arrows indicate the direction of clamping.

Figure 9A:
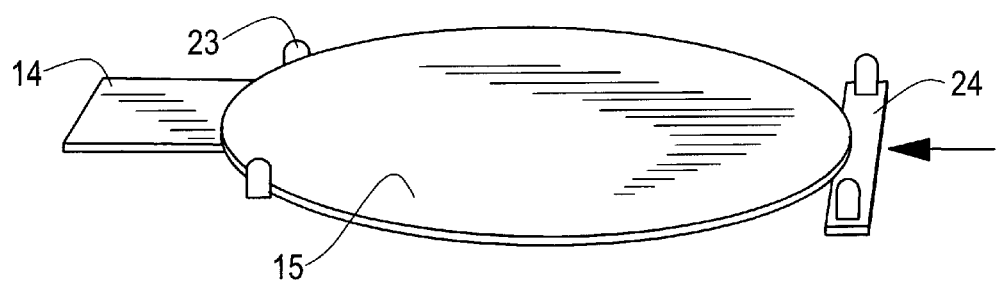
Figure 9B:
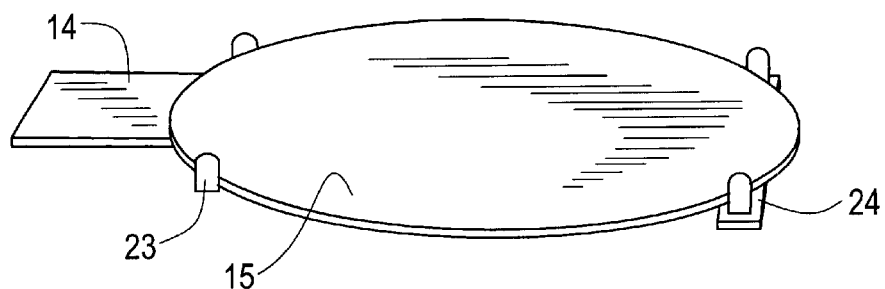

FIGS. 9a and b show a lateral positioning by limit stop pairs 23, 24, at least the limit stop pair 24 being displaceable (see arrow in FIG. 9a).

Figure 10:
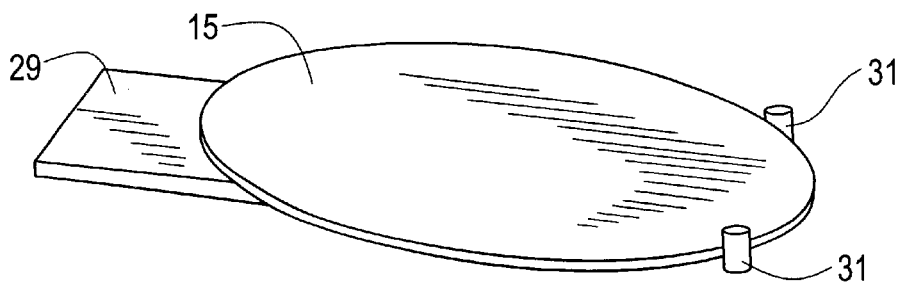

FIG. 10 shows an inclined support arm 29 on whose front end there are limit stops 31 toward which a wafer 15 levitated on the support arm 29 slides.

Figure 11:
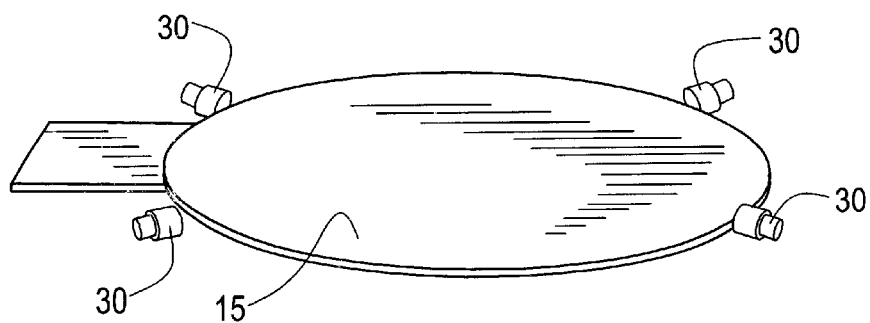

In FIG. 11, the wafer 15 on the support arm 14 is laterally positioned without contact by means of four ultrasonic generators 30. This represents a particularly elegant way of holding the wafer in a completely contactless manner during transfer.

It is also possible to position a wafer laterally on a support arm using nozzles from which air flows out. In this case, the nozzles can be arranged in the same way as the ultrasonic generators 30 in FIG. 11, or one or two nozzles are used which press the wafer toward one or more limit stops.

Depending on the environmental conditions, differently designed support arms can be used in accordance with FIGS. 2a to 5b. The representation according to FIGS. 2a and b provides an example of fork-shaped support arms 25. A plate-shaped support arm 26 is depicted in FIGS. 3a and 3b.

FIG. 4a shows the possible use of several support arms forming a bearing plane, for example two support arms 27.

Figure 5:
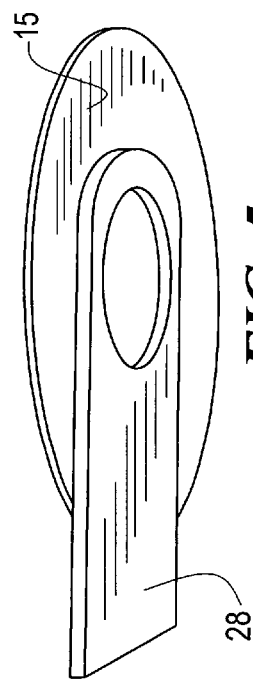

Finally, FIG. 5 shows a support arm 28 as an example of support arms with openings. In addition, the shapes 25, 26 and 27 just mentioned can also have any desired openings made in them.

It has been found surprisingly that all the shapes mentioned can be set in flexural vibration using a vibration generator so that levitation of a wafer 15 placed on them is possible. By contrast, exclusively rectangular flexural vibrators are known from the prior art which are all larger in terms of area than the components which are levitated by them.

The shape of the support arms 25 to 29 is preferably adapted to the environmental conditions such that the wafer can be taken up particularly easily and then deposited again.

| List of reference numbers | |
|---|---|
| 1 | Front part |
| 2 | Wafer handler |
| 3 | Transfer system |
| 4 | Vibration generator |
| 5 | Coupling element |
| 6 | Support arm |
| 7 | Connection element |
| 8 | Connection piece |

-continued

List of reference numbers

| | |
|---|---|
| 9 | Wafer |
| 10 | Suction head |
| 11 | Suction head |
| 12 | Arrow |
| 13 | Arrow |
| 14 | Support arm |
| 15 | Wafer |
| 16 | Suction head |
| 17 | Suction head |
| 18 | Limit stop |
| 19 | Limit stop |
| 20 | Clamp device |
| 21 | Clamp jaw |
| 22 | Clamp jaw |
| 23 | Limit stop pair |
| 24 | Limit stop pair |
| 25 | Support arm |
| 26 | Support arm |
| 27 | Support arm |
| 28 | Support arm |
| 29 | Support arm |
| 30 | Ultrasound generator |
| 31 | Limit stop |

What is claimed is:

1. A handler for transporting a substrate comprising:
a movable carrying arm for supporting the substrate in a predetermined position on said arm;
active positioning means operative to impart a force along an edge of said substrate to maintain said substrate in said predetermined position; and
an ultrasonic oscillator mechanically coupled to said carrying arm and operative to impart an ultrasonic vibration to said carrying arm to produce a levitation of said substrate on said carrying arm, wherein said active positioning means is distinct from said ultrasonic oscillator.

2. The handler according to claim 1 wherein said oscillator is operative to generate an essentially stationary vibration having plurality of vibration nodes.

3. The handler according to claim 1 wherein said carrying arm comprises a generally planar carrying arm and said oscillator is operative to cause vibration of said carrying arm along a vibration axis that is generally perpendicular to a plane generally defined by said planar carrying arm.

4. The handler according to claim 1 wherein said carrying arm includes at least one opening extending through said carrying arm to provide access to said substrate through said carrying arm.

5. The handler according to claim 1 wherein said active positioning means comprises at least one suction head operative to urge the substrate toward said suction head and a limit stop intermediate said suction head and said substrate.

6. The handler according to claim 1 further including at least one buffer for restraining lateral movement of a substrate disposed on said carrying arm.

7. The handler according to claim 1 further including at least one clamping device for restraining lateral movement of a substrate disposed on said carrying arm.

8. The handler according to claim 1 wherein at least one of said active positioning means comprises a non-contacting device for maintaining lateral positioning of said substrate without contacting said edge of said substrate.

9. The handler according to claim 8 wherein said at least one active positioning means comprises a sonic reflector.

10. The handler according to claim 8 wherein said active positioning means includes a plurality of ultrasonic generators disposed around said predetermined position, said ultrasonic generators operative to maintain said substrate in said predetermined position without contacting the edge of said substrate.

11. The handler of claim 1 wherein at least one of said active positioning means comprises a pneumatic positioning means.

12. A handler for transporting a substrate comprising:
a movable carrying arm having a generally planar support surface for supporting the substrate in a predetermined position on said arm, said carrying arm having a distal end;
at least two spaced limit stops disposed at the distal end of said carrying arm, said limit stops defining said predetermined position, said carrying arm being inclined downward toward said distal end; and
an ultrasonic oscillator mechanically coupled to said carrying arm and operative to impart an ultrasonic vibration to said carrying arm to produce a levitation of said substrate disposed on said carrying arm, such that said substrate disposed on said inclined carrying arm slides downward into abutting relation with said at least two limit stops.

* * * * *

UNITED STATES PATENT AND TRADEMARK OFFICE
CERTIFICATE OF CORRECTION

PATENT NO. : 6,609,874 B2
DATED : August 26, 2003
INVENTOR(S) : Jürgen Höppner et al.

It is certified that error appears in the above-identified patent and that said Letters Patent is hereby corrected as shown below:

<u>Title page,</u>
Item [75], Inventors, "Schlip" should read -- Schilp --;
Insert item -- [30] Foreign Application Priority Data    DE 100 39 482.5   8/8/2000 --;
Item [74], *Attorney, Agent, or Firm*, "Labovici" should read -- Lebovici --.

Signed and Sealed this

Second Day of March, 2004

JON W. DUDAS
*Acting Director of the United States Patent and Trademark Office*